(12) United States Patent
Mountsier et al.

(10) Patent No.: US 9,379,210 B2
(45) Date of Patent: Jun. 28, 2016

(54) SACRIFICIAL PRE-METAL DIELECTRIC FOR SELF-ALIGNED CONTACT SCHEME

(71) Applicant: Lam Research Corporation, Fremont, CA (US)

(72) Inventors: Thomas Weller Mountsier, San Jose, CA (US); Bart J. van Schravendijk, Palo Alto, CA (US); Ananda K. Banerji, West Linn, OR (US); Nagraj Shankar, Tualatin, OR (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 14/883,457

(22) Filed: Oct. 14, 2015

(65) Prior Publication Data

US 2016/0071953 A1    Mar. 10, 2016

Related U.S. Application Data

(62) Division of application No. 14/479,733, filed on Sep. 8, 2014, now Pat. No. 9,190,489.

(51) Int. Cl.
*H01L 21/336* (2006.01)
*H01L 29/66* (2006.01)
*H01L 29/78* (2006.01)
*H01L 21/762* (2006.01)
*H01L 21/28* (2006.01)
*H01L 21/311* (2006.01)

(52) U.S. Cl.
CPC .... *H01L 29/66545* (2013.01); *H01L 21/28008* (2013.01); *H01L 21/31111* (2013.01); *H01L 21/31144* (2013.01); *H01L 29/66553* (2013.01)

(58) Field of Classification Search
None
See application file for complete search history.

(56) References Cited

U.S. PATENT DOCUMENTS

| 8,268,722 | B2 | 9/2012 | Yu et al. | |
|---|---|---|---|---|
| 2008/0286916 | A1* | 11/2008 | Luo | H01L 29/665 438/197 |
| 2011/0111533 | A1 | 5/2011 | Varadarajan et al. | |
| 2012/0264262 | A1* | 10/2012 | Zhu | H01L 29/7833 438/197 |

(Continued)

OTHER PUBLICATIONS

U.S. Appl. No. 14/479,733, titled "Sacrificial Pre-Metal Dielectric for Self-Aligned Contact Scheme," filed Sep. 8, 2014.

(Continued)

*Primary Examiner* — Khaja Ahmad
(74) *Attorney, Agent, or Firm* — Weaver Austin & Villeneuve & Sampson LLP

(57) ABSTRACT

Various embodiments herein relate to formation of contact etch stop layers in the context of forming gates and contacts. In certain embodiments, a novel process flow is used, which may involve the deposition and removal of a sacrificial pre-metal dielectric material before a particular contact etch stop layer is formed. An auxiliary contact etch stop layer may be used in addition to a primary etch stop layer that is deposited previously. In certain cases the contact etch stop layer is a metal-containing material such as a nitride or an oxide. The contact etch stop layer may be deposited through a cyclic vapor deposition in some embodiments. The process flows disclosed herein provide improved protection against over-etching gate stacks, thereby minimizing gate-to-contact leakage. Further, the disclosed process flows result in wider flexibility in terms of materials and deposition conditions used for forming various dielectric materials, thereby minimizing parasitic capacitance.

7 Claims, 3 Drawing Sheets

(56) References Cited

U.S. PATENT DOCUMENTS

2013/0071977 A1* 3/2013 Scheiper .......... H01L 21/76224
        438/299
2015/0235835 A1    8/2015 Swaminathan et al.

OTHER PUBLICATIONS

Notice of Allowance dated Jul. 29, 2015, issued in U.S. Appl. No. 14/479,733.

* cited by examiner

SACRIFICIAL PRE-METAL DIELECTRIC FOR SELF-ALIGNED CONTACT SCHEME

BACKGROUND

This application is a divisional of and claims priority to U.S. patent application Ser. No. 14/479,733, titled "SACRIFICIAL PRE-METAL DIELECTRIC FOR SELF-ALIGNED CONTACT SCHEME," filed Sep. 8, 2014, all of which is incorporated herein by reference and for all purposes.

BACKGROUND

Fabrication of semiconductor devices such as field effect transistors (FETs) involves sequential deposition and etching of various layers and structures. Integration schemes employing spacer and cap materials may be used to minimize leakage between a gate and a contact and therefore produce high quality devices.

SUMMARY

Certain embodiments herein relate to methods of fabricating gates and contacts in a semiconductor device. In one aspect of the embodiments herein, a method is provided for forming gates and contact cavities, the method including: (a) forming a plurality of dummy gate structures on the substrate, each dummy gate structure including (i) a capping layer, (ii) a layer including silicon positioned under the capping layer, and (iii) a spacer layer in contact with vertical sidewalls of the capping layer and the layer of silicon; (b) depositing a primary contact etch stop layer over the dummy gate structures and over an active region on the substrate; (c) depositing a sacrificial pre-metal dielectric material in a plurality of gaps positioned between adjacent dummy gate structures; (d) removing the capping layer and the layer of silicon from the dummy gate structures; (e) depositing a plurality of replacement metal gates including a metal structure and a cap layer positioned over the metal structure, where the replacement metal gates are deposited in spaces previously occupied by the capping layer and the layer of silicon of the dummy gate structures; (f) removing the sacrificial pre-metal dielectric material; (g) depositing an auxiliary contact etch stop layer, where the auxiliary contact etch stop layer is in physical contact with the primary contact etch stop layer, the spacer layer, and the cap layer of the replacement metal gate; (h) depositing replacement dielectric material over the auxiliary contact etch stop layer, where the replacement dielectric material is deposited in gaps between adjacent replacement metal gates and over the replacement metal gates; and (i) etching through the replacement dielectric material, the auxiliary contact etch stop layer, and the primary contact etch stop layer to expose the active region below the primary contact etch stop layer and between adjacent replacement metal gates, thereby forming the contact cavities.

In some embodiments, at least one of the primary contact etch stop layer and the auxiliary contact etch stop layer include a metal-containing material. The metal in the metal-containing material may be aluminum and/or magnesium in some examples. The aluminum and/or magnesium may be provided in the form of a nitride or oxide.

Deposition of the auxiliary contact etch stop layer may include a number of steps, for example: flowing a metal-containing precursor into a reaction chamber and exposing the substrate to the metal-containing precursor under conditions that allow the metal-containing precursor to adsorb to a surface of the substrate, purging the reaction chamber to remove a substantial portion of non-adsorbed metal-containing precursor from the reaction chamber, and flowing a second precursor into the reaction chamber and converting the metal-containing precursor and second precursor to form the auxiliary contact etch stop layer. In certain embodiments, flowing the metal-containing precursor, purging the reaction chamber, and flowing the second precursor into the reaction chamber and converting occur cyclically. A number of techniques can be used to convert the materials. For instance, converting the metal-containing precursor and second precursor may include exposing the substrate to plasma. In these or other cases, converting the metal-containing precursor and second precursor include exposing the substrate to UV radiation and/or an elevated temperature.

Other example materials that may be used for the primary etch stop layer or the auxiliary etch stop layer include at least one of SiN, SiCN, and SiCO, and combinations thereof. In some embodiments, the primary etch stop layer includes at least one of SiN, SiCN, SiCO, and a combination thereof, and the auxiliary etch stop layer includes a metal-containing material. In other embodiments, the primary etch stop layer includes a metal-containing material and at least one of SiN, SiCN, SiCO, and a combination thereof. In other embodiments, both the primary etch stop layer and the auxiliary etch stop layer include a metal-containing material. In still other embodiments, both the primary etch stop layer and the auxiliary etch stop layer include at least one of SiN, SiCN, SiCO, and a combination thereof.

In certain embodiments, the replacement dielectric material is a low-k material having a dielectric constant of about 7 or below, for example about 5 or below. In these or other cases, the cap layer in the replacement metal gate may include a low-k material having a dielectric constant of about 7 or below, for example about 5 or below. The spacer layer may similarly be a low-k material having a dielectric constant of about 7 or below, or about 5 or below.

In some embodiments, the method further includes partially removing the replacement gate material; depositing a replacement gate cap material over the sacrificial pre-metal dielectric and the remaining portions of the replacement gates; and planarizing the deposited replacement gate cap material to remove it from regions over the pre-metal dielectric. The disclosed embodiments may be used to achieve wider processing windows for various operations. For instance, in some cases selectively etching through the replacement pre-metal dielectric and contact etch stop layer is performed under conditions that would significantly erode the dielectric spacers if not protected by the contact etch stop layer deposited in (f).

In another aspect of the disclosed embodiments, a method of forming gates and contact cavities, is provided, the method including: (a) forming a plurality of dummy gate structures on a substrate, the dummy gate structures including (i) a capping layer, (ii) a layer including silicon positioned under the capping layer, and (iii) a spacer layer in contact with vertical sidewalls of the capping layer and the layer of silicon; (b) depositing sacrificial pre-metal dielectric material between adjacent dummy gate structures; (c) removing the capping layer and the layer of silicon from the dummy gate structures; (d) forming replacement metal gates including a metal structure and a cap layer positioned over the metal structure, where the replacement metal gates are formed in locations where the capping layer and the layer of silicon were removed from the dummy gate structures; (e) removing the sacrificial pre-metal dielectric material; (f) depositing a contact etch stop layer in physical contact with the spacer layer, the cap layer of the replacement metal gate, and an active region on the substrate; (g) depositing replacement dielectric material over the contact etch stop layer, where the replacement dielectric material is deposited in gaps positioned between adjacent replacement metal gates and over the replacement metal gates; and (h) etching through the replacement dielectric material and the contact etch stop layer to expose the active region below the contact etch stop layer and between adjacent replacement metal gates, thereby forming the contact cavities.

In certain embodiments, the contact etch stop layer includes a metal-containing material. For instance, the metal in the metal-containing material may include aluminum and/or magnesium. The metal may be provided in the form of an oxide or nitride in various cases.

A number of steps may be undertaken in forming the contact etch stop layer, including: flowing a metal-containing precursor into a reaction chamber and exposing the substrate to the metal-containing precursor under conditions that allow the metal-containing precursor to adsorb to a surface of the substrate, purging the reaction chamber to remove a substantial portion of non-adsorbed metal-containing precursor from the reaction chamber, and flowing a second precursor into the reaction chamber and converting the metal-containing precursor and second precursor to form the auxiliary contact etch stop layer. Different conversion operations are available. In some cases, converting the metal-containing precursor and second precursor include exposing the substrate to plasma. In these or other cases, converting the metal-containing precursor and second precursor include exposing the substrate to UV radiation and/or an elevated temperature.

As noted, one advantage of the disclosed method is a wider window for certain other materials and processing conditions. For instance, in some cases at least one of the replacement dielectric material, the spacer layer, and the cap layer in the replacement metal gate comprises a low-k material having a dielectric constant of about 7 or below, for instance about 5 or below. In certain embodiments the contact etch stop layer may be deposited to a thickness between about 1-50 nm, for example between about 2-10 nm.

In a further aspect of the disclosed embodiments, a method of fabricating a transistor is provided, the method including: (a) forming a plurality of dummy gate structures adjacent to a plurality of electrical contact regions for source and/or drain regions, each dummy gate structure including a dielectric spacer separating one of the contact regions and a dummy gate abutting the spacer; (b) forming a sacrificial pre-metal dielectric over the plurality of dummy gate structures and adjacent electrical contact regions; (c) removing the dummy gates while substantially preserving the spacers and the sacrificial pre-metal dielectric positioned over the electrical contact regions; (d) forming replacement gates where the dummy gates were located; (e) removing the sacrificial pre-metal dielectric, where after removing the sacrificial pre-metal dielectric, a plurality of replacement gate structures and the adjacent electrical contact regions are exposed, each of the replacement gate structures including a replacement gate and an associated dielectric spacer; (f) forming a contact etch stop layer over the plurality of replacement gate structures and adjacent electrical contact regions; (g) forming a replacement pre-metal dielectric over the contact etch stop layer; and (h) selectively etching through the replacement pre-metal dielectric and contact etch stop layer to expose the electrical contact regions without exposing the replacement gates.

The electrical contact region may include either (i) an active region or (ii) a primary contact etch stop layer and an underlying active region. The dummy gate may include a silicon portion and a cap layer including SiN, SiCN, and/or SiCO. In certain cases, forming the sacrificial pre-metal dielectric includes depositing a pre-metal dielectric material over the dummy gate structures and adjacent contact regions, and planarizing the deposited pre-metal dielectric material. In various cases, the sacrificial pre-metal dielectric includes silicon dioxide. The silicon dioxide may be doped or made porous in some embodiments. In certain cases, forming the replacement gates includes: depositing a replacement gate material over the sacrificial pre-metal dielectric and in regions where the dummy gates resided; and planarizing the deposited replacement metal gate material to remove it from regions over the sacrificial pre-metal dielectric.

In a further aspect of the disclosed embodiments, a method of forming a transistor is provided, the method including: (a) providing a partially fabricated semiconductor device including: (i) a plurality of replacement gate structures adjacent to a plurality of electrical contact regions for source and/or drain regions, each replacement gate structure including a replacement gate and a dielectric spacer separating the replacement gate from one of the electrical contact regions, where the dielectric spacer abuts the replacement gate, and (ii) a sacrificial pre-metal dielectric positioned over the plurality of electrical contact regions; and (b) removing the sacrificial pre-metal dielectric, where after removing the sacrificial pre-metal dielectric, a plurality of replacement gate structures and the adjacent electrical contact regions are exposed; (c) forming a contact etch stop layer over the plurality of replacement gate structures and adjacent electrical contact regions; (d) forming a replacement pre-metal dielectric over the contact etch stop layer; and (e) selectively etching through the replacement pre-metal dielectric and contact etch stop layer to expose the electrical contact regions without exposing the replacement gates.

These and other features will be described below with reference to the associated drawings.

DETAILED DESCRIPTION

In this application, the terms "semiconductor wafer," "wafer," "substrate," "wafer substrate," and "partially fabricated integrated circuit" are used interchangeably. One of ordinary skill in the art would understand that the term "partially fabricated integrated circuit" can refer to a silicon wafer during any of many stages of integrated circuit fabrication thereon. A wafer or substrate used in the semiconductor device industry typically has a diameter ranging from less than 100 mm to 450 mm. The following detailed description assumes the invention is implemented on a wafer. However, the invention is not so limited. The work piece may be of various shapes, sizes, and materials. In addition to semiconductor wafers, other work pieces that may take advantage of this invention include various articles such as printed circuit boards, magnetic recording media, magnetic recording sensors, mirrors, optical elements, micro-mechanical devices and the like.

In the following description, numerous specific details are set forth in order to provide a thorough understanding of the presented embodiments. The disclosed embodiments may be practiced without some or all of these specific details. In other instances, well-known process operations have not been described in detail to not unnecessarily obscure the disclosed embodiments. While the disclosed embodiments will be described in conjunction with the specific embodiments, it will be understood that it is not intended to limit the disclosed embodiments. Certain documents may be incorporated by reference into this specification. It should be understood that any disclaimers or disavowals contained in such documents are not intended to limit the current embodiments unless such disclaimers or disavowals are otherwise asserted in the present specification or during prosecution of the present specification.

Conventional methods for forming field effect transistors (FETs) can sometimes result in undesirably high leakage between a contact and a gate. This leakage is problematic and can cause failure of a fabricated device. The leakage problem is described further with respect to FIGS. 1A-1F.

Figure 1A:
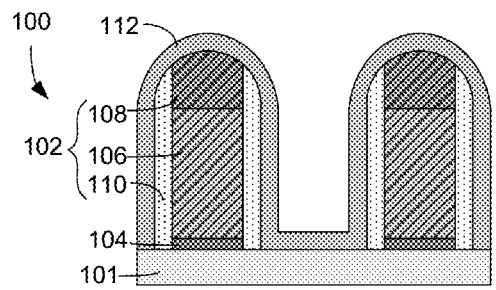
FIGS. 1A-1F illustrate a partially fabricated semiconductor device during various stages of processing where a single contact etch stop layer is used.

FIGS. 1A-1F present cross-sectional views of a partially fabricated semiconductor device during different stages of fabrication. FIG. 1A depicts a partially fabricated semiconductor device 100 including an underlying substrate layer 101 (e.g., a silicon substrate) with dummy gate structures 102 formed thereon. The dummy gates are located where final gates are to be formed. The dummy gates include sacrificial material that is removed in later processing, as described below. The dummy gate structures 102 are formed on a gate dielectric layer 104 (e.g., an oxide, which may be a thermally grown oxide such as thermal silicon dioxide. As used herein, the term silicon oxide is intended to include silicon dioxide as well as other non-stoichiometric forms of silicon oxide.), and include at least an amorphous or polycrystalline silicon layer 106, a capping layer 108 (e.g., a nitride layer such as silicon nitride), and a spacer layer 110. The spacer layer 110 is vertically oriented and abuts the gate dielectric 104, the silicon layer 106 and the cap layer 108, as shown. The spacer layer may be formed from dielectric material such as silicon nitride. Only a portion of the dummy gate structure 102 is actually removed as a sacrificial material. Particularly, the cap layer 108 and the silicon layer 106 are removed (as described below), and these portions together may be referred to as a dummy gate (not labeled). The gate dielectric 104 is also removed and replaced with another gate dielectric 105. Notably, the spacer layer 110 may largely remain intact in a finished device.

A contact etch stop layer (CESL) 112 may be formed over the dummy gate structures 102 and the exposed underlying substrate layer 101. Typical materials for the CESL include SiN, SiCN, and SiCO. The purpose of the CESL is to confine etching to particular regions (between adjacent gate structures) during the contact etch process. Source and drain contacts in the final device are made to source and drain regions in an underlying active region between spacers of adjacent gates. The active region is sometimes also referred to as an active layer, though those of ordinary skill in the art understand that the active layer/region may be in the basic silicon wafer substrate itself. The CESL should have good etch resistance to the chemistry that is later used to etch the region where a contact forms.

After the structure shown in FIG. 1A is formed, pre-metal dielectric 114 is deposited in cavities/regions between adjacent dummy gate structures 102, such cavities being lined by the CESL 112. Typically the pre-metal dielectric 114 is an oxide (e.g., silicon dioxide), and may be deposited through various processes such as high density plasma (HDP) deposition, spin-on deposition, sub-atmospheric CVD (SACVD), atomic layer deposition (ALD), and flowable material deposition. The purpose of the pre-metal dielectric is to provide isolation between the active device layer and the first metallization layer, and also to isolate adjacent gates. The partially fabricated device 100 is then subject to chemical mechanical polishing (CMP) to remove a top portion (including any overburden pre-metal dielectric), resulting in the structure shown in FIG. 1B. The CMP process typically stops at or near an interface between the CESL 112 and the cap layer 108 such that much of the cap layer 108 remains after the CMP process.

Figure 1E:
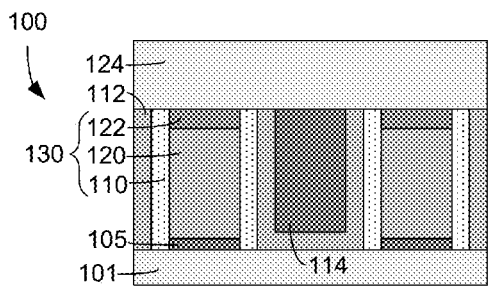
Figure 1B:
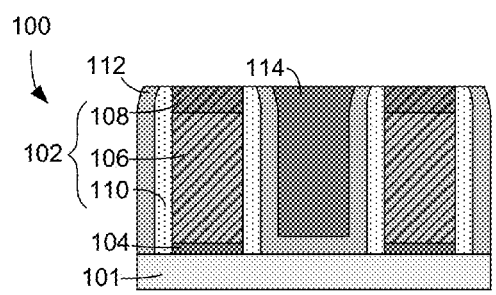
Figure 1F:
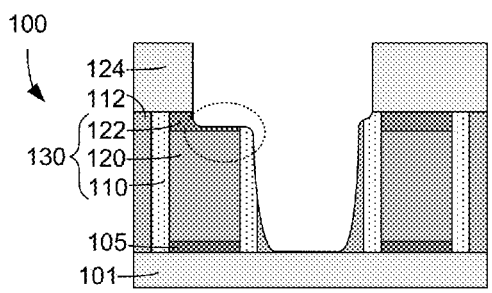
Figure 1C:
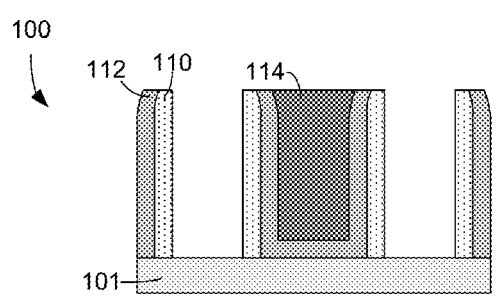
Figure 1D:
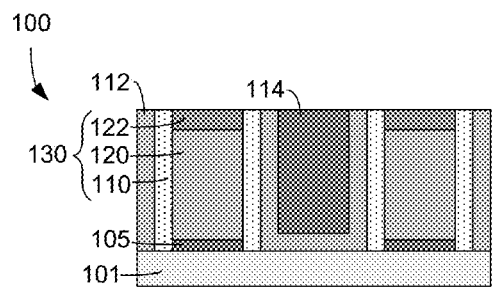

After the structure in FIG. 1B is formed, the remaining cap layer 108 and the silicon layer 106 of the dummy gate stack 102, as well as the gate dielectric 104 are removed to form the structure in FIG. 1C. The gate dielectric 104 is typically removed so that new gate material 105 with high dielectric constant (for instance $HfO_2$) can be deposited. This replacement material may also be referred to as a gate dielectric 105. Next, a replacement metal gate (RMG) is formed in the cavities where the silicon layer 106 and cap layer 108 (i.e., the dummy gates) were previously located. The RMG includes a metal structure 120 and a cap layer 122. The replacement metal gate structure (RMG structure) 130 includes the replacement metal gate (metal structure 120 and cap layer 122) and the spacer layer 110. The RMG serves as the final gate electrode in the final device, which results after the fabrication process completes. The metal structure 120 may include very thin work function layers at relevant positions (e.g., using n-metal and p-metal as needed). The remaining portion of the metal structure 120 may include metal or metals having good fill performance such as tungsten, aluminum, cobalt, or a combination thereof. After the metal structure 120 is deposited, a CMP process is undertaken, and metal that was deposited over the pre-metal dielectric 114 is thereby removed. An etching process may take place to etch back the metal structure 120 to some degree. Next, the cap layer 122 is formed on the metal structure 120. The cap layer may be silicon nitride in some cases, while SiCN and SiCO are used in certain other cases. The cap layer 122 and the spacer layer 110 serve to isolate the gate electrode from the source/drain contacts. After deposition of the cap layer 122, another CMP process is completed to form the structure in FIG. 1D.

Next, a layer of contact dielectric 124 is deposited to form the structure shown in FIG. 1E. The contact dielectric 124 may be silicon nitride, for example. The contact dielectric 124 may be the same or different material than the pre-metal dielectric 114. The purpose of the contact dielectric 124 is to extend dielectric material up to a height where a first metallization layer is formed. A contact etch is then performed to etch a cavity in the contact dielectric 124/pre-metal dielectric 114. The CESL 112, gate cap layer 122, and spacer layer 110 help confine the etch profile to the desired cavities between the RMG structures and also help prevent shorting at the top of the gate. This results in the structure shown in FIG. 1F. The cavity may then be filled to form the contact. After the contact etch, contact and back-end-of-line (BEOL) processing proceed as desired.

Unacceptably high leakage current or even a short circuit between the gate and the contact may result if the cavity formed during the contact etch comes too close to the metal structure 120. The region highlighted in the dotted oval of FIG. 1F illustrates an example region where such leakage can be problematic. Because the CESL layer 112 does not cover the cap layer 122 or the top portions of the spacer layer 110 after the replacement metal gate is formed (see FIG. 1D), there is risk of over-etch of the cap layer 122 during the contact etch. The cap layer 122 is considered to be over-etched if it is left insufficiently thick to adequately protect against leakage in a finished device. The minimum thickness to protect against leakage depends on the type of device, the application the device is used for, as well as the operating voltage and other requirements. The contact etch must be performed for a sufficient duration to penetrate the pre-metal dielectric 114 and the CESL 112 below the pre-metal dielectric 114 (because the contact formed in this cavity must extend to the active layer 101). This duration may also be sufficient to over-etch the cap layer 122 and/or spacer layer 110.

Contact Etch Stop Layer Material and Deposition

In various embodiments herein, the process described with relation to FIGS. 1A-1F is modified to reduce the risk of unacceptable leakage. One type of modification may involve the use of an alternative material for the CESL. An alternative or additional type of modification that may be made is the use of an auxiliary CESL, which may be made of conventional CESL materials or the alternative CESL materials disclosed herein. Where an auxiliary CESL is used, the process flow may be modified to deposit the auxiliary CESL at an appropriate time, as discussed further below. Typically where an auxiliary CESL is used, the partially fabricated device includes a previously deposited CESL. In other words, the auxiliary CESL is often deposited in addition to another CESL.

The material used to fabricate an alternative and/or auxiliary CESL should have an excellent etch resistance to the contact etch (which generally etches silicon oxide). Further, the CESL material should resist the chemical mechanical polishing of silicon oxide. The CESL material should also be a good insulator (e.g., having a low leakage and high breakdown strength, for instance a breakdown strength of about 8 MV/cm or greater), and in many cases it is beneficial for the CESL material to have a dielectric constant that is sufficiently low (e.g., below about 7, for example below about 5). The CESL material may be a metal-containing compound, for example a compound including aluminum or magnesium. Other metals and metal-containing compounds may be used in other certain embodiments. In various cases the CESL material may be a metal nitride. In other cases the CESL material is a metal oxide. Particular examples of CESL materials include aluminum nitride (AlN), aluminum oxide ($Al_2O_3$), aluminum oxynitride (AlON), magnesium nitride ($Mg_3N_2$), magnesium oxide (MgO), and combinations thereof. The material may or may not be stoichiometric. Other materials that meet the qualifications mentioned above may also be used. In some cases the CESL material is deposited by chemical vapor deposition (CVD) or by a cyclic method such as atomic layer deposition (ALD). The deposition may occur in a plasma-assisted process. These deposition methods allow the CESL material to be deposited with excellent conformality in high aspect ratio gaps. The stress and composition of the CESL material can be tuned by controlling the deposition conditions (e.g., RF power levels, RF frequency, RF exposure times, dose times, flow rates, purge times, pressure, temperature, etc.). One example deposition process is described below.

In various embodiments, formation of the CESL begins with exposing the substrate surface to a metal-containing precursor in a reaction chamber. In certain cases the reaction chamber may be part of a chemical vapor deposition (CVD) or atomic layer deposition (ALD) apparatus such as SEQUEL™ and VECTOR™ PECVD tools available from Lam Research Corporation of Fremont, Calif. Organometallic compounds, metal hydrides, metal halides, and metal carbonyls may serve as suitable metal-containing reactants. For example, alkyl-substituted metal derivatives and cyclopentadienyl-substituted metal derivatives may be used. Example precursors are listed below. The metal-containing reactant adsorbs onto the surface of the substrate and reacts (e.g., decomposes) at a high temperature to form a metal-containing precursor layer on the substrate. In general, depending on the nature of the precursor, the deposition conditions are optimized to deposit the metal-containing precursor layer with the desired qualities. For example, the temperature range may be optimized to favor a particular decomposition mechanism for a precursor, thereby tuning the composition of the metal-containing precursor layer as desired. Typically, the metal-containing precursor is delivered in the absence of plasma. The layer formed by the metal-containing precursor may also be referred to as a precursor layer. In certain embodiments, the flow of metal-containing precursor may be between about 10-350 sccm, for a duration between about 7.5-30 seconds, assuming a reactor volume of about 180 L. The metal-containing precursor may be delivered in an inert carrier gas such as argon, hydrogen, helium, or nitrogen, which may flow at a rate between about 50-1000 sccm. When a carrier gas is used to expose the substrate to the metal-containing precursor, the overall flow rate of metal-containing precursor may be higher, such as between about 10-200 sccm of pure metal-containing reactant vapor (e.g., TMA) for a carrier gas flow between about 150-950 sccm. In some embodiments, the overall flow rate of TMA may be lower. As noted above, the conditions may be tuned for particular precursors and other conditions.

The thickness of the precursor layer may be controlled to form a monolayer or a saturated layer as determined by the thermodynamics of adsorption. For example, in some embodiments the precursor layer thickness is no more than the thickness of the precursor that can be adsorbed by the substrate. Thus, in some embodiments the process is adsorption-controlled, and deposition of uncontrollably large amounts of material is avoided. The purge step (described below) can help ensure that the thickness of the precursor layer is limited by adsorption characteristics. The thickness of the precursor layer can also be tuned by controlling precursor flow rates, substrate exposure times, substrate temperature, and other parameters of a deposition process.

As mentioned above, in some cases, the metal-containing reactant includes aluminum, and/or magnesium.

Example aluminum-containing reactants include, but are not limited to, trialkylaluminum precursors (e.g., trimethylalumium (TMA), triethylalumium (TEA), and triisobutylaluminum (TIBA). Other examples of aluminum-containing reactants include aluminum tris(2,2,6,6-tetramethyl-3,5-heptanedionate) and tris(dimethylamido)aluminum(III). Hydride-containing organometallic precursors, such as dimethylaluminumhydride (DMAH) can also be used.

Example magnesium-containing reactants include, but are not limited to, organometallic magnesium-containing precursors, such as -bis(cyclopentadienyl)magnesium, bis(ethylcyclopentadienyl)magnesium, bis(pentamethylcyclopentadienyl)magnesium, bis(n-propylcyclopentadienyl)magnesium, and other appropriate precursors.

Next, the reaction chamber may be purged to remove unadsorbed precursor material. The purge may include evacuating the reaction chamber and/or sweeping the reaction chamber with inert gas. The purge may be substantially complete (such that only trace amounts of unadsorbed metal-containing precursor remain) or less than substantially complete. In certain embodiments, the flow rate of the purge gas is between about 15-500 sccm. The purge gas is introduced after the flow of the metal-containing precursor is stopped. As mentioned, the purge time or duration of purge may be insufficient to completely purge the aluminum-containing precursor in the gas phase such that there is both surface adsorption as well as residual metal-containing precursor in the gas phase in the reaction space not on the surface of the substrate or loosely adhered to the substrate. In many embodiments, the purge time to dose time ratio, such as the operation 102 to operation 101 time ratio for example, may be between about 3:1 and about 20:1, e.g., between about 3.75:1 and about 15:1. In some embodiments, the purge time is less than about 5 seconds, e.g., between about 0.1 second and about 5 seconds, or about 2 seconds. In some embodiments, the purge may be accomplished by evacuating the reaction chamber.

After the reaction chamber is purged, a conversion step occurs. The conversion step involves delivering a second reactant to the reaction chamber and reacting the second reactant with the adsorbed metal-containing reactant on the substrate surface. The second reactant may be a nitrogen-containing reactant, an oxygen-containing reactant, a carbon-containing reactant, or some combination thereof. The second reactant may flow to the reaction chamber at a rate between about 0.1-20 SLM, for example between about 1-10 SLM. The duration over which the second reactant flows into the reaction chamber may be between about 1-60 seconds, for example between about 2.5-30 seconds. The second reactant may be delivered in an inert carrier gas, which may flow at a rate between about 500 sccm-10 SLM. The second reactant may also be delivered with hydrogen gas, which may act to remove residual organic groups from the metal precursor layer. In various embodiments, a resulting layer has a thickness of about 1.5 Å or greater, typically greater than 3 Å/cycle.

Example nitrogen-containing reactants include, but are not limited to, nitrogen, ammonia, hydrazine, amines (e.g., amines bearing carbon) such as methylamine, dimethylamine, ethylamine, isopropylamine, t-butylamine, di-t-butylamine, cyclopropylamine, sec-butylamine, cyclobutylamine, isoamylamine, 2-methylbutan-2-amine, trimethylamine, diisopropylamine, diethylisopropylamine, di-t-butylhydrazine, as well as aromatic containing amines such as anilines, pyridines, and benzylamines. Amines may be primary, secondary, tertiary or quaternary (for example, tetraalkylammonium compounds). A nitrogen-containing reactant can contain heteroatoms other than nitrogen, for example, hydroxylamine, t-butyloxycarbonyl amine and N-t-butyl hydroxylamine are nitrogen-containing reactants.

Example oxygen-containing reactants include, but are not limited to, oxygen, ozone, nitrous oxide, carbon monoxide, nitric oxide, nitrogen dioxide, sulfur oxide, sulfur dioxide, oxygen-containing hydrocarbons ($C_xH_yO_z$), water, mixtures thereof, etc.

The reaction between the metal-containing reactant and the second reactant may be driven by plasma, thermal, or UV energy in certain embodiments. In other embodiments, the reaction may happen simply as a result of the two precursors coming into contact with one another. Where plasma conversion is desired, such plasma may be from any available source (e.g., an inductively coupled plasma, a capacitively coupled plasma, a microwave plasma, remote plasma, in-situ plasma, etc.). Remotely generated plasmas may be beneficial in some cases due to the relatively milder conditions compared to in-situ plasmas. A remote plasma is generated in a chamber that is physically separated from the chamber housing the substrate. A remote plasma is depleted of ionic species once it is delivered to the substrate, thus reducing the risk of damage to the substrate.

The frequency used may include a high frequency (HF) component and/or a low frequency (LF) component. Low frequency RF power refers to RF power having a frequency between 100 kHz and 2 MHz. A typical frequency range for LF plasma source is between about 100 kHz to 500 kHz, e.g., 400 kHz frequency may be used. High frequency power refers to RF power with a frequency greater than 2 MHz. Typically HF RF frequency lies in the range of between about 2 MHz-30 MHz. Commonly used HF RF values include 13.56 MHz and 27 MHz. In some embodiments LF power ranging from about 0 W/cm$^2$ to 1.0 W/cm$^2$, and HF power ranging from 0.1-1.5 W/cm$^2$ can be used in plasma assisted operations such as the conversion step.

Where thermal conversion is desired, the wafer may be heated to a temperature of at least about 300-350° C. in the presence of the second reactant. Such thermal treatment is particularly advantageous for treating substrates containing delicate ULK dielectrics.

Where UV conversion is desired, the substrate may be exposed to a UV light source in the presence of the second reactant. Conversion using UV is further discussed and described in U.S. patent application Ser. No. 12/646,830, filed Dec. 23, 2009, which is herein incorporated by reference.

The conversion step is sometimes referred to as a post-treatment step, since it occurs after deposition of the precursor layer. Various conversion processes are described in U.S. patent application Ser. No. 12/688,154, filed Jan. 15, 2010, and incorporated herein by reference. Any of these conversion processes are suitable for use with the methods described herein.

After the conversion step is performed, the reaction chamber may be purged by evacuating and/or sweeping the chamber. In many embodiments, purging includes flowing a purge gas, such as, for example, nitrogen ($N_2$). In some embodiments, the purge gas is flowed between about 5 seconds to about 10 seconds, or about 6 seconds at a flow rate between about 0 sccm and about 10,000 sccm. This purge may be sufficient to remove substantially all of the remaining second reactant in gas phase from the reaction space, or station, or chamber.

The basic operations of metal-containing reactant dose, purge, conversion, and purge may then be repeated to form a film having a desired thickness.

In one particular example, an aluminum nitride CESL is used. Particular process conditions for depositing aluminum nitride are discussed in U.S. patent application Ser. No. 14/183,287, filed Feb. 18, 2014, and titled "HIGH GROWTH RATE PROCESS FOR CONFORMAL ALUMINUM NITRIDE," which is herein incorporated by reference in its entirety.

While much of the discussion herein focuses on conversion steps that result in a nitrogen-containing film, other types of conversions may be used, and other types of film may be formed. For example, oxidizing conversion to form metal-O bonds may be implemented by contacting the substrate having an exposed metal-containing precursor layer to an oxygen-containing gas (such as $O_2$, $CO_2$, $N_2O$, etc.) in a plasma. In other embodiments, metal-C bonds are formed in the conversion step, for example, by treating the precursor layer with a hydrocarbon in a plasma. Metal-S, metal-Se, metal-Te, and metal-P films can be formed in the conversion step by exposing the substrate to a reactant containing a required element, e.g., $H_2S$, $H_2Se$, $H_2Te$, $PH_3$, respectively, with or without a plasma. Both direct plasma and remote plasma can be used for these types of conversion operations.

In certain embodiments, a metal-containing CESL as described above is deposited according to the process flow described in relation to FIG. 1. In some implementations, a metal-containing CESL as described above is deposited as an auxiliary CESL. The auxiliary CESL is deposited in addition to a primary CESL, as described below. The primary CESL may be a metal-containing CESL as disclosed above, or it may be a more conventional CESL material.

Process Flows for Depositing CESL Materials

One issue that can arise where the process flow of FIG. 1 is used is over-etching of the spacer layer 110 and the cap layer 122 in the replacement metal gate structure 130. This over-etching can expose the metal structure 120 in the replacement metal gate structure 130. Such exposure is problematic when the contact material is deposited in the cavity formed by the contact etch. The contact material should not come in direct physical contact with the metal structure in the replacement metal gate.

In order to reduce the risk of over-etching, a different process flow may be used. For instance, an auxiliary CESL may be deposited in addition to a primary CESL, as shown in FIGS. 2A-2H. In another example shown in FIGS. 3A-3H, a primary CESL may be deposited at a different time than what is shown in FIGS. 1A-1F, without deposition of an auxiliary CESL.

Figure 2A:
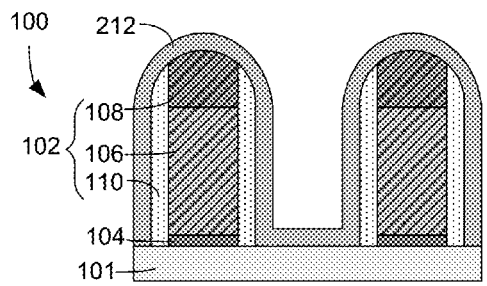
FIGS. 2A-2H illustrate a partially fabricated semiconductor device during various stages of processing where an auxiliary contact etch stop layer is used in addition to a primary contact etch stop layer.
Figure 2E:
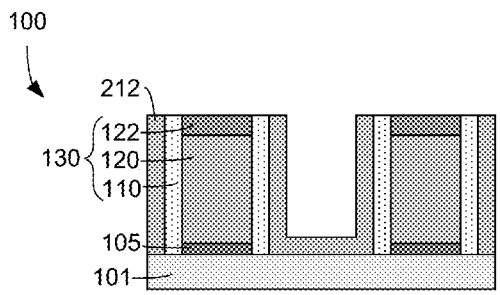
Figure 2B:
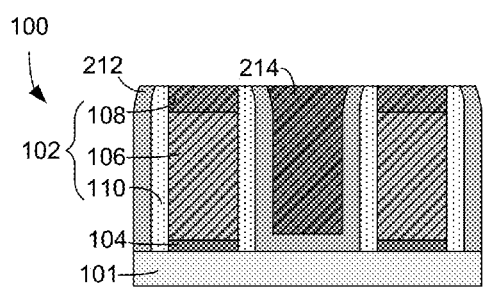
Figure 2F:
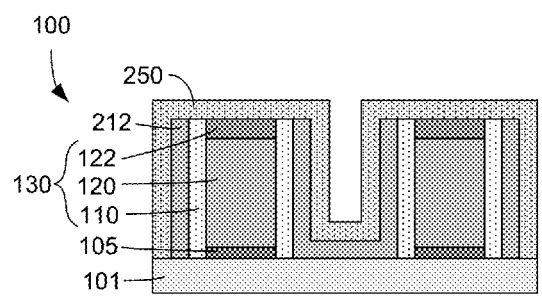
Figure 2C:
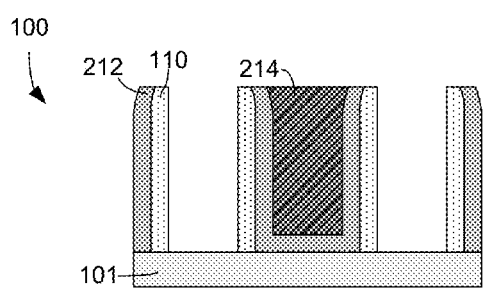
Figure 2G:
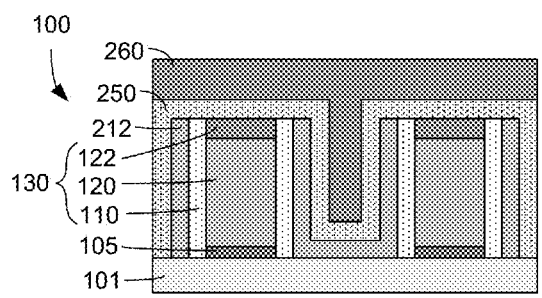
Figure 2D:
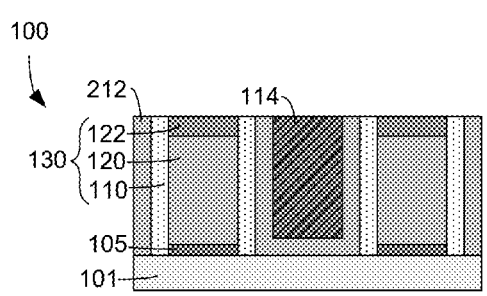

FIGS. 2A-2H illustrate a process flow where both a primary CESL and an auxiliary CESL are used. FIGS. 2A-2D closely correspond to FIGS. 1A-1D, and for the sake of brevity the description will not be repeated. One notable difference is that the pre-metal dielectric material 114 in FIGS. 1A-1D is a sacrificial pre-metal dielectric material 214 in FIGS. 2A-2D. The sacrificial pre-metal dielectric 214 is removed and replaced with a replacement dielectric 260, as shown in FIG. 2G and further described below. The sacrificial PMD material 214 should be easily etched, and should have good etch selectivity over the material used for the spacer 110 and cap layers 122 (which are often nitride materials). In other words, the sacrificial PMD material 214 should be chosen such that it is easy to remove the sacrificial PMD material 214 without removing the spacer 110 or the cap 122. In a particular example, the sacrificial PMD is silicon oxide, though the embodiments are not so limited. The silicon oxide (e.g., $SiO_2$) may be doped with one or more elements. In some cases the silicon oxide has a porosity introduced such that it etches more quickly. Another difference between these figures is that the CESL 112 shown in FIGS. 1A-1F is referred to in FIGS. 2A-2H as a "primary CESL 212." The primary CESL 212 may be made from conventional CESL materials or from metal-containing materials as described above. The term "primary" is included to distinguish the primary CESL 212 from the auxiliary CESL 250.

FIG. 2E shows the partially fabricated device 100 after the sacrificial pre-metal dielectric material 214 is removed. The sacrificial pre-metal dielectric 214 may be removed through wet or dry etching operations. One example wet etching operation involves placing the device in a wet bath containing dilute HF. The dilute HF dissolves silicon oxide (e.g., the sacrificial PMD) while leaving the silicon nitride (e.g., the spacer, cap layer, and in some cases the primary CESL) largely intact. Other wet and dry etching operations may be used as appropriate. A related process flow (not shown) in which an auxiliary CESL is deposited without removing the pre-metal dielectric would be less desirable because the auxiliary CESL would cover the pre-metal dielectric, which could cause problems during the contact etch.

Next, the auxiliary CESL 250 is deposited as a blanket layer that is in direct physical contact with the primary CESL 212, spacer 110, and cap 122, as shown in FIG. 2F. The auxiliary CESL 250 may be a metal-containing material as described above. Conventional CESL materials may also be used for the auxiliary CESL 250 (e.g., silicon nitride, silicon carbide, etc.). It is beneficial for the auxiliary CESL material 250 to resist etching during the contact etch (however, such etch resistance should not be complete, at least in a horizontal orientation, since the contact etch must etch through the auxiliary CESL 250 between the replacement gate structures 130 to reach the active region 101). In many cases an auxiliary CESL material 250 resists the contact etch better than a conventional CESL material. The auxiliary CESL 250 provides improved protection against over-etching of the spacer 110 and cap 122 during the contact etch. This improved protection reduces the risk that the metal structure 120 becomes exposed during the contact etch. In some embodiments, the auxiliary CESL 250 has a thickness between about 1 nm-50 nm, for example between about 2 nm-10 nm. Regardless, the position of auxiliary CESL 250 over the top of the replacement metal gate and spacer 110 provides added protection against exposure of the RMG during the contact etch.

Next, replacement dielectric 260 is deposited over the auxiliary CESL 250, as shown in FIG. 2G. The replacement dielectric 260 may be the same material as the sacrificial pre-metal dielectric 214, or it may be a different material. One advantage of using the process flow shown in FIGS. 2A-2H is an increased flexibility for the replacement dielectric material 260 compared to the pre-metal dielectric material 114 used in FIGS. 1A-1F. For example, the choice of material for the pre-metal dielectric 114 (in the process flow of FIGS. 1A-1F) and the sacrificial pre-metal dielectric 214 (in the process flow of FIGS. 2A-2G) may be constrained due to the chemical mechanical polishing steps described above. The pre-metal dielectric 114 and sacrificial pre-metal dielectric 214 structures/materials provide mechanical stability to the structure during chemical mechanical polishing. While it may be desirable to use low-k materials or other types of materials in the area such dielectric materials occupy (e.g., to reduce parasitic capacitance), these low-k materials can be challenging to planarize with CMP. For instance, where low-k materials are used, it may be more difficult to stop a CMP process at a desired time/location. The modified process flow shown in FIGS. 2A-2H allows the different dielectric materials (the sacrificial PMD 214 and the replacement dielectric 260) to be separately optimized for their individual purposes. For example, the sacrificial pre-metal dielectric 214 can be a material selected to provide good CMP results (e.g., silicon oxide), and the replacement dielectric 250 can be a material selected to provide other desirable qualities (e.g., low dielectric constant, low leakage, high breakdown field). Further factors that make silicon oxide a good candidate for the sacrificial pre-metal dielectric include the ease of gate integration and high temperature stability. The replacement dielectric 260 may be silicon dioxide or a low-k material such as carbon doped oxide, etc. Low-k materials may be beneficial in that they reduce parasitic capacitance in the device.

A similar advantage to the process flow illustrated in FIGS. 2A-2H is an increased flexibility in the materials chosen for the spacer layer 110 and the cap 122. In conventional process flows, the material of the cap layer 122 is chosen to provide good etch resistance to prevent over-etching and exposure of the metal structure 120 during the contact etch. Unfortunately, materials that exhibit good etch resistance also tend to have relatively high dielectric constants. Although it may be desired to use a lower-k material for the cap layer 122, these materials are generally not available because they do not provide sufficient etch resistance. Where an auxiliary CESL 250 is used, the auxiliary CESL 250 provides much of the desired etch resistance. Thus, there is more flexibility as to the materials chosen for the cap layer 122, as well as the spacer layer 110. Similarly, even if conventional spacer and cap materials are used, the auxiliary CESL 250 and its improved etch protection allow increased flexibility in the process windows used to deposit the spacer and cap materials. In some embodiments, a material used in a spacer layer 110 or cap layer 122 may be a low-k material. As noted above, low-k materials may be beneficial in reducing parasitic capacitance. In some embodiments, the material chosen for the spacer layer 110 and/or cap layer 122 may have a dielectric constant of about 7 or lower, for example about 5 or lower. Conventionally, spacer and cap materials in these field effect transistor (FET) applications have a dielectric constant that is about 6 or greater. These higher dielectric constants are not desirable, but are tied to the high etch resistance that such layers may need where no auxiliary (or alternative material) CESL is provided. Although the disclosed process flow involves certain extra steps (e.g., removal of sacrificial PMD, deposition of auxiliary CESL, and deposition of replacement dielectric), these additional steps will be provide significant benefits related to minimized risk of leakage and parasitic capacitance, increased flexibility in choosing cap material, spacer material, and replacement dielectric material, expanded processing windows for forming such materials, and an expanded processing window for performing the contact etch.

The replacement dielectric 260 may be deposited through various methods. In some cases a two-step process is used where a first step fills the gaps between the replacement metal gate structures 130 and a second step deposits additional overburden up to the level where a first metallization layer is formed. In other cases the deposition occurs in a single step. Example processes for depositing the replacement dielectric 260 (and the sacrificial PMD 214) include, but are not limited to, spin-on glass methods, sub-atmospheric chemical vapor deposition (SACVD) methods, high density plasma chemical vapor deposition (HDPCVD) methods, chemical vapor deposition (CVD) methods, atomic layer deposition (ALD) methods, and flowable material methods.

Figure 2H:
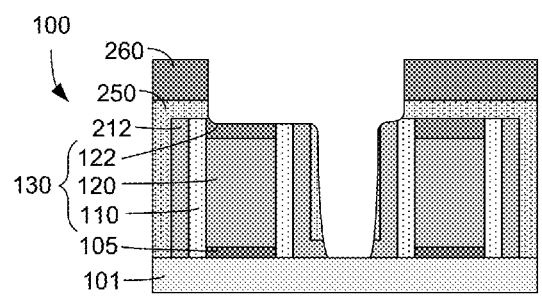

After the replacement dielectric 260 is deposited, the contact etch is performed, resulting in the structure shown in FIG. 2H. After this step, contact and BEOL processing proceed as normal. Due to its location over the RMG and spacer, the auxiliary CESL 250 provides better etch protection compared to where no auxiliary CESL is used. The primary CESL 212 and the cap layer 122 are etched to a lesser degree, and spacer faceting is reduced, compared to the process flow shown in FIGS. 1A-1F. The improved etch protection minimizes the risk that the metal structure 120 becomes exposed or nearly exposed during the contact etch, resulting in devices that are more robust and less likely to be (or become) defective. By maintaining a sufficient thickness of dielectric material around the metal structure in the replacement metal gate, contact-to-gate leakage and breakdown failure are minimized.

Figure 3A:
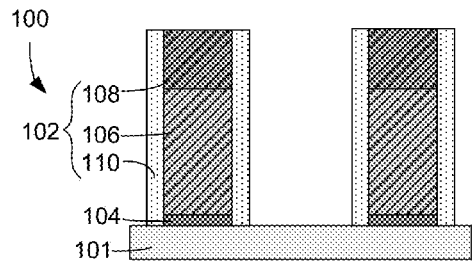
FIGS. 3A-3H depict a partially fabricated semiconductor device during various stages of processing where a single contact etch stop layer is deposited after formation of a replacement metal gate.
Figure 3E:
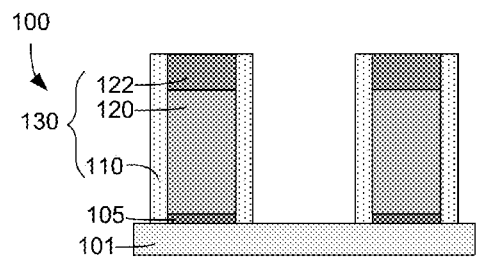
Figure 3B:
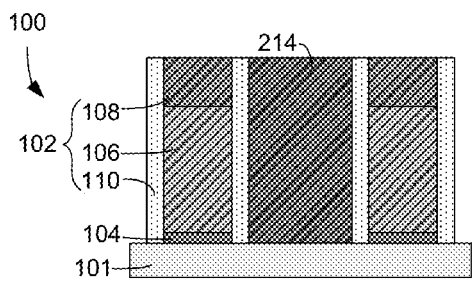
Figure 3F:
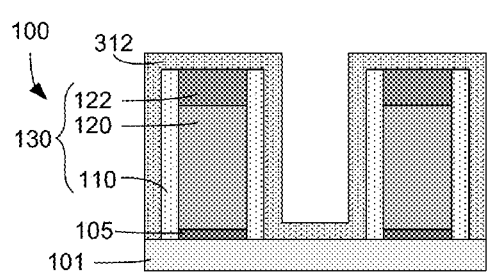
Figure 3C:
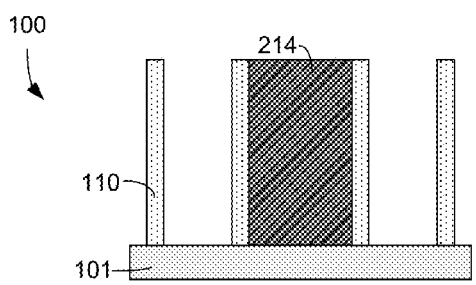
Figure 3G:
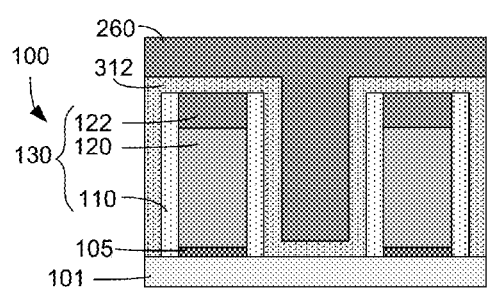
Figure 3D:
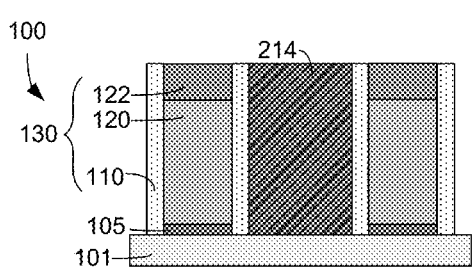
Figure 3H:
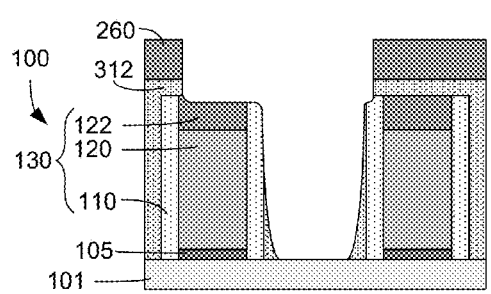

In another alternative process flow, only a single CESL is used, but it is deposited at a different time than what is shown in FIGS. 1A-1F. An example of such a process flow is shown in FIGS. 3A-3H. The process begins with a substrate as shown in FIG. 3A. On an active layer or region 101 and a gate dielectric 104 is deposited a dummy gate structure 102 including an amorphous or polycrystalline silicon layer 106, a capping layer 108, and a spacer layer 110. Within the dummy gate structure 102 is a dummy gate (not labeled) including the silicon layer 106 and the capping layer 108. Next, a sacrificial pre-metal dielectric material 214 is deposited between the dummy gate structures 102 and a CMP process takes place to form the structure shown in FIG. 3B. Then, the dummy gates (i.e., the silicon layer 106 and the capping layer 108) are removed to form the structure shown in FIG. 3C. After the dummy gates and gate dielectric 104 are removed, a new gate dielectric 105 and replacement metal gates are deposited including a metal structure 120 and a cap layer 122. These depositions may involve CMP. The metal structure 120, cap layer 122, and spacer layer 110 together form a replacement metal gate structure 130. Next, the sacrificial pre-metal dielectric material 214 is removed to form the structure shown in FIG. 3E. At this point in the process, the CESL 312 is deposited as a blanket of material, which is in direct physical contact with the active layer 101, the spacer layer 110, and the cap layer 122. In this embodiment the CESL may be deposited to a thickness between about 1-50 nm, for example between about 2-10 nm. Deposition of the CESL 312 results in the structure shown in FIG. 3F. The CESL 312 may be a conventional CESL material or it may be a metal-containing material as described above. In one example the CESL 312 is aluminum nitride. In another example the CESL 312 is aluminum oxide or aluminum oxynitride. Other CESL materials that may be used are discussed above. After deposition of the CESL 312, replacement dielectric 260 is deposited in the gaps between neighboring replacement metal gate structures 130. The replacement dielectric 260 is deposited up to the height of a contact, resulting in the structure shown in FIG. 3G. Next, a contact etch is performed to result in the structure shown in FIG. 3H. Because the CESL 312 was deposited after formation of the replacement metal gates, the CESL is able to provide good protection against over-etching, thereby minimizing the risk of exposing or nearly exposing the metal structure 120.

The benefits related above with respect to the process flow shown in FIGS. 2A-2G also apply to the process flow shown in FIGS. 3A-3G (though possibly to a lesser degree considering there is only a single CESL present). In particular, such benefits may relate to increased flexibility in the material and deposition conditions for forming the cap layer 122 and the spacer layer 110, increased flexibility/optimization of the replacement dielectric 260, and reduced risk of forming defective devices.

Apparatus

The methods described herein may be performed by any suitable apparatus or combination of apparatus. Various deposition steps may occur in a chemical vapor deposition apparatus or an atomic layer deposition apparatus, for example the Altus® product family, Vector® product family, and/or Speed® product family apparatus available from Lam Research Corporation of Fremont, Calif. Other deposition processes such as spin-on and flowable film processes may occur in apparatus designed for such purposes. The etching processes may also occur in any suitable apparatus including wet processing apparatus and dry processing apparatus. Examples of suitable apparatus may include the Kiyo® product family and the Versys® product family, also available from Lam Research Corporation. The disclosed embodiments are not limited to a particular apparatus or combination of apparatus, and any suitable apparatus may be used.

A suitable apparatus generally includes hardware for accomplishing the process operations and a system controller having instructions for controlling process operations in accordance with the present invention. For example, in some embodiments, the hardware may include one or more process stations included in a process tool.

System Controller

In some implementations, a controller is part of a system, which may be part of the above-described examples. Such systems can comprise semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The controller, depending on the processing requirements and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the controller may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The controller, in some implementations, may be a part of or coupled to a computer that is integrated with, coupled to the system, otherwise networked to the system, or a combination thereof. For example, the controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters may be specific to the type of process to be performed and the type of tool that the controller is configured to interface with or control. Thus as described above, the controller may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

The various hardware and method embodiments described above may be used in conjunction with lithographic patterning tools or processes, for example, for the fabrication or manufacture of semiconductor devices, displays, LEDs, photovoltaic panels and the like. Typically, though not necessarily, such tools/processes will be used or conducted together in a common fabrication facility.

Lithographic patterning of a film typically comprises some or all of the following steps, each step enabled with a number of possible tools: (1) application of photoresist on a workpiece, e.g., a substrate having a silicon nitride film formed thereon, using a spin-on or spray-on tool; (2) curing of photoresist using a hot plate or furnace or other suitable curing tool; (3) exposing the photoresist to visible or UV or x-ray light with a tool such as a wafer stepper; (4) developing the resist so as to selectively remove resist and thereby pattern it using a tool such as a wet bench or a spray developer; (5) transferring the resist pattern into an underlying film or workpiece by using a dry or plasma-assisted etching tool; and (6) removing the resist using a tool such as an RF or microwave plasma resist stripper. In some embodiments, an ashable hard mask layer (such as an amorphous carbon layer) and another suitable hard mask (such as an antireflective layer) may be deposited prior to applying the photoresist.

It is to be understood that the configurations and/or approaches described herein are exemplary in nature, and that these specific embodiments or examples are not to be considered in a limiting sense, because numerous variations are possible. The specific routines or methods described herein may represent one or more of any number of processing strategies. As such, various acts illustrated may be performed in the sequence illustrated, in other sequences, in parallel, or in some cases omitted. Likewise, the order of the above described processes may be changed.

The subject matter of the present disclosure includes all novel and nonobvious combinations and sub-combinations of the various processes, systems and configurations, and other features, functions, acts, and/or properties disclosed herein, as well as any and all equivalents thereof.

What is claimed is:

1. A method of fabricating a transistor, the method comprising:
   (a) forming a plurality of dummy gate structures adjacent to a plurality of electrical contact regions for source and/or drain regions, each dummy gate structure comprising a dielectric spacer separating one of the contact regions and a dummy gate abutting the spacer;
   (b) forming a sacrificial pre-metal dielectric over the plurality of dummy gate structures and adjacent electrical contact regions;
   (c) removing the dummy gates while substantially preserving the spacers and the sacrificial pre-metal dielectric positioned over the electrical contact regions;
   (d) forming replacement gates where the dummy gates were located;
   (e) removing the sacrificial pre-metal dielectric, wherein after removing the sacrificial pre-metal dielectric, a plurality of replacement gate structures and the adjacent electrical contact regions are exposed, each of the replacement gate structures comprising a replacement gate and an associated dielectric spacer;
   (f) forming a contact etch stop layer over the plurality of replacement gate structures and adjacent electrical contact regions;
   (g) forming a replacement pre-metal dielectric over the contact etch stop layer; and
   (h) selectively etching through the replacement pre-metal dielectric and contact etch stop layer to expose the electrical contact regions without exposing the replacement gates.

2. The method of claim 1, wherein each of the electrical contact regions comprises either (i) an active region or (ii) a primary contact etch stop layer and an underlying active region.

3. The method of claim 1, wherein the dummy gate comprises a silicon portion and a cap layer comprising SiN, SiCN, or SiCO.

4. The method of claim 1, wherein forming the sacrificial pre-metal dielectric comprises depositing a pre-metal dielectric material over the dummy gate structures and adjacent contact regions, and planarizing the deposited pre-metal dielectric material.

5. The method of claim 1, wherein the sacrificial pre-metal dielectric comprises silicon dioxide.

6. The method of claim 5, wherein the silicon dioxide is doped or made porous.

7. The method of claim 1, wherein forming the replacement gates comprises:
   depositing a replacement gate material over the sacrificial pre-metal dielectric and in regions where the dummy gates resided; and
   planarizing the deposited replacement metal gate material to remove it from regions over the sacrificial pre-metal dielectric.

* * * * *